(12) United States Patent  
Winkler et al.

(10) Patent No.: US 9,268,376 B2
(45) Date of Patent: Feb. 23, 2016

(54) MOBILE COMPUTING DEVICE DOCK STATION WITH HEADSET JACK HEAT PIPE INTERFACE

(71) Applicant: Google Technology Holdings LLC, Mountain View, CA (US)

(72) Inventors: David A. Winkler, Spring Grove, IL (US); Morris B. Bowers, Grayslake (IL); Maninder S. Sehmbey, Hoffman Estates, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 411 days.

(21) Appl. No.: 13/737,388

(22) Filed: Jan. 9, 2013

(65) Prior Publication Data

US 2014/0192480 A1  Jul. 10, 2014

(51) Int. Cl.
*H05K 7/20* (2006.01)
*G06F 1/20* (2006.01)
*G06F 1/16* (2006.01)

(52) U.S. Cl.
CPC .............. *G06F 1/203* (2013.01); *G06F 1/1632* (2013.01); *H05K 7/20336* (2013.01)

(58) Field of Classification Search
CPC ...................................................... G06F 1/1632
See application file for complete search history.

(56) References Cited

U.S. PATENT DOCUMENTS

| | | | | |
|---|---|---|---|---|
| 5,339,638 A * | 8/1994 | Kessel | ..................... | B60H 1/32 62/3.6 |
| 5,898,569 A * | 4/1999 | Bhatia | ......................... | 361/700 |
| 5,946,191 A * | 8/1999 | Oyamada | ..................... | 361/700 |
| 6,069,791 A | 5/2000 | Goto et al. | | |
| 6,084,769 A * | 7/2000 | Moore et al. | ............. | 361/679.47 |
| 6,111,751 A * | 8/2000 | Sakuyama | .................... | 361/704 |
| 6,118,654 A * | 9/2000 | Bhatia | ....................... | 361/679.52 |
| 6,172,871 B1 * | 1/2001 | Holung et al. | ........... | 361/679.47 |
| 6,181,553 B1 * | 1/2001 | Cipolla et al. | ........... | 361/679.54 |
| 6,313,987 B1 * | 11/2001 | O'Connor et al. | ....... | 361/679.46 |
| 6,434,001 B1 | 8/2002 | Bhatia | | |
| 6,445,580 B1 * | 9/2002 | Cohen et al. | ............. | 361/679.47 |
| 6,560,104 B2 * | 5/2003 | DeHoff et al. | ........... | 361/679.52 |

(Continued)

FOREIGN PATENT DOCUMENTS

TW          547802 U1 *  8/2003

OTHER PUBLICATIONS

Burrus, Philip et al.: "Novel Heat Sinking Techniques", Original Publication Date: Jun. 1, 1999, IP.com Electronic Publication: Aug. 6, 2002, IP.com No. IPCOM000009075D, all pages.

*Primary Examiner* — Robert J Hoffberg
(74) *Attorney, Agent, or Firm* — Wolfe-SBMC

(57) ABSTRACT

An improved electronic communications system 100 features a holder assembly 104 such as a mobile computing device dock station 106 and dock heat exchanger providing an external heat sink 162 which when coupled with a user-friendly heat transfer device 164 such as a heat pipe can transfer heat from internal electronic components 146, 148 and 154 and an internal heat sink 157 of an electronic communications device 102, such as a cellular phone or mobile computing device, via a special headset jack-heat pipe interface 167 to help cool the electronic communications device 102. The electronic communications device 102 can also include one or more thermal couplings 158-160 for coupling and providing a thermal pathway(s) from at least one of the internal electronic components 146, 148 and 154 to the internal heat sink 157.

20 Claims, 4 Drawing Sheets

(56) References Cited

U.S. PATENT DOCUMENTS

| | | | |
|---|---|---|---|
| 6,601,179 B1 * | 7/2003 | Jackson et al. | 713/322 |
| 6,674,640 B2 * | 1/2004 | Pokharna et al. | 361/679.48 |
| 6,829,142 B2 | 12/2004 | Belady et al. | |
| 7,048,038 B2 * | 5/2006 | Pokharna et al. | 165/104.21 |
| 7,342,783 B2 * | 3/2008 | Park | 361/679.48 |
| 7,375,967 B2 * | 5/2008 | Huang et al. | 361/707 |
| 7,403,384 B2 * | 7/2008 | Pflueger | 361/688 |
| 7,823,625 B2 | 11/2010 | Gammons | |
| 7,839,640 B2 | 11/2010 | Hayashi et al. | |
| 7,942,705 B2 * | 5/2011 | Murphy et al. | 439/668 |
| 7,974,090 B2 | 7/2011 | Risher-Kelly | |
| 8,325,483 B2 * | 12/2012 | Kondoh | H04B 1/036 361/679.54 |
| 8,804,338 B2 * | 8/2014 | Nagasawa | 361/704 |
| 8,844,126 B2 * | 9/2014 | Frederick | H01R 13/33 29/592.1 |
| 2001/0033475 A1 * | 10/2001 | Lillios et al. | 361/687 |
| 2002/0122298 A1 * | 9/2002 | Cohen et al. | 361/687 |
| 2009/0283103 A1 | 11/2009 | Nielsen et al. | |
| 2013/0309899 A1 * | 11/2013 | Sehmbey et al. | 439/485 |
| 2013/0319640 A1 * | 12/2013 | Cavallaro et al. | 165/121 |
| 2014/0185241 A1 * | 7/2014 | MacDonald | 361/704 |

* cited by examiner

MOBILE COMPUTING DEVICE DOCK STATION WITH HEADSET JACK HEAT PIPE INTERFACE

BACKGROUND OF THE INVENTION

1. Field of the Disclosure

The disclosure relates in general to electronic communications systems and more particularly to a mobile computing device dock station with a headset jack-heat pipe interface.

2. Background Art

In recent years, demands are increasing for downsizing, slimming, and enhancing performance of electronic devices such as cellular phones. In response to such demands, high performance integrated circuit (IC) chips have been installed in a variety of electronic devices. At the same time, the power and heat generated by these chips has significantly increased. Excessively hot temperatures in electronic device can cause performance problems, malfunctions, charging problems, circuit overloads, short circuiting, and component failure, as well as heat burns and other injuries to the user.

Computer and cellular (cell) phone processors generate more heat from more powerful processors the longer the processors are used and the more programs and applications (APs) are being used. When cell phones are used for an extended period of time, especially for process-heavy applications, they heat up more than usual. The phone's battery heats up when the phone is in use for a phone call, in navigating with a global positioning system (GPS), or when used for video streaming, video viewing and/or recording. Hot batteries have trouble charging.

A heat sink disperses heat from other parts, components, and structures. Heat sinks are used in computers as well as cellular (cell) phones. A radiator draws heat away from a car's engine, while an internal heat sink draws heat away from a cell phone's central processing unit (CPU). Internal heat sinks can effectively cool some of the heat emitted from cell phone processors, such as from processors that simultaneously run multiple programs. Without a quality heat sink and heat transfer system, a cell phone processor is at risk of overheating and its performance limited by maximum allowable temperature limits.

Heat can be transferred in three different ways: convection, radiation, and conduction. Conduction of heat is transferred in a solid, such as in a heat sink. Conduction occurs when two objects with different temperatures come into contact with one another. At the point where the two objects meet, the faster moving molecules of the warmer object crash into the slower moving molecules of the cooler object. When this happens, the faster moving molecules from the warmer object give energy to the slower moving molecules, which in turn heats the cooler object. This process is known as thermal conductivity, which is how internal heat sinks transfer heat away from the cell phone processor.

The temperature of the surface of a portable electronic device is a function of the temperature of the operational components disposed within the portable electronic device. To provide a satisfactory user experience, the surface temperatures of the portable electronic devices should be managed within a certain temperature range, one example of which ensures that the surface of a portable electronic device never exceeds about 38° C. If the surface temperature exceeds this predetermined threshold, the performance of internal components may need to be throttled to stay within certain parameters. The cause of mobile temperature rise is the dissipation within the components in the mobile electronics device. Moreover, in addition to surfaces, other components within the device can also become heated by being located in proximity to the heat generating components. Examples of these heat contact path components include the battery and display.

The functional performance of portable electronic devices, such as mobile computing devices, is limited by the amount of heat that is dissipated due to operating temperature limits of their internal components, such as the main battery, display, and other parts and components of the mobile computing devices. A particularly challenging environment is when a portable electronic device is cradled in a car dock due to the extra heat load and thermal radiation intensity from the sun.

Many conventional cell phones and other electronic devices with high end applications processors (APs), modems, and multiple power amplifiers (PAs) are generating more heat than the cell phone or other electronic device can support by itself without going over the specified surface temperature and component temperature limits. There is a major need to remote this heat to facilitate acceptable and even better performance of cell phones and other electronic devices.

It is, therefore, desirable to provide an improved mobile communications system with a mobile computing device dock station and a headset jack heat pipe interface, which overcomes most, if not all of the preceding disadvantages.

DETAILED DESCRIPTION OF THE INVENTION

Figure 1:
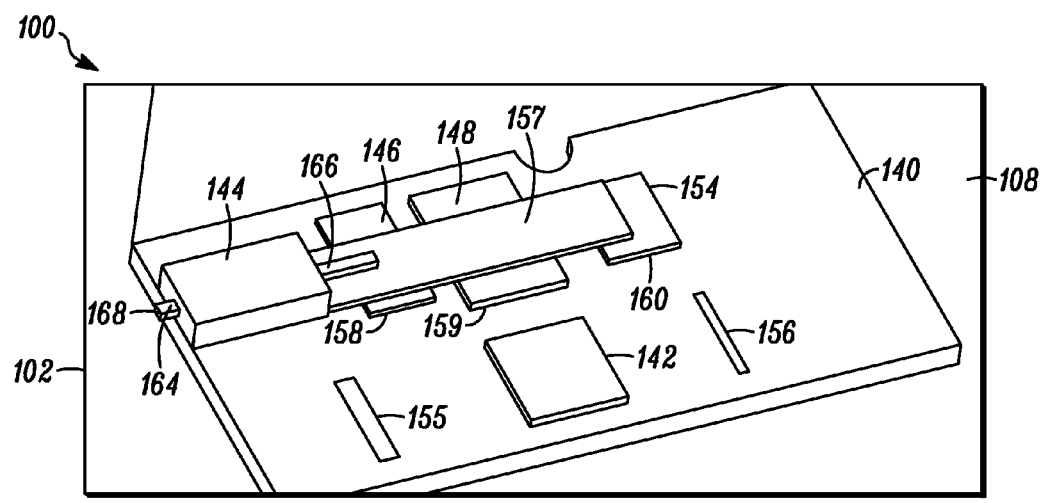
FIG. 1 is an enlarged diagrammatic perspective view of part of an electronic communications system with a headset jack-heat pipe interface for help cooling electronic components in an electronic communications device in accordance with principles of the present invention.

An improved mobile electronics communications system is provided with a mobile computing device dock station with a headset jack-heat pipe interface for help cooling an electronic communications device. Advantageously, the improved mobile communications system is efficient, effective and attractive.

The improved mobile electronics communications system is different from conventional communications systems because it uses the headset jack as the physical interface to draw heat from the portable electronic device. The existing port of the headset jack and the design of the headset jack can serve a dual electrical and thermal function. Significantly, the improved mobile communications system can provide remote heat sinking from the mobile electronic communications device to the dock to facilitate enhanced performance of the mobile electronic communications device.

In the illustrative embodiment, the improved mobile electronics communications system provides a multi-function use of the headset jack port as a means to thermally couple the high power dissipating components of an electronic communications device, such as a portable computing device, to a dock heat exchanger via a heat pipe. When the electronic communications device is placed in a car dock, the heat pipe can be inserted into the headset jack where a thermal interface couples components such as the applications processor to the heat exchanger on the dock. This arrangement and system can greatly extend the operational performance of the portable computing device or other electronic communications device when mated with the special dock. The improved mobile communications system provides a practical and effective means of cooling in a dock without the need for new holes in the housing. It can be used in almost any mobile phone because most of them feature a headset jack for audio output.

The improved mobile electronic communications system can include a combination of the elements and features: (1) heat generating components in a mobile communications electronic device which are heat sunk to a common heat-spreader and collector that is thermally terminated to the headset jack; (2) a dock-mobile interface with a heat pipe that mates into the headset jack to provide a thermal conduit; and (3) a dock with a heat sink that provides a heat exchanger to dissipate heat from the mobile communications electronic device to ambient surroundings. The heat pipe can comprise a probe-like insert for connection to the dock and the headset jack connector of the electronic communications device. Accessory devices such as docks, lap docks, and cradles afford an opportunity to remote the heat by using the remote accessory as an additional heat sink, such as a fan, heat pipe, or conduction based heat exchanger.

The improved mobile communications system can provide a heat-pipe based interface mechanism on the dock/accessory that is inserted into and through the headset jack to provide a thermal connection to the heat generating components of the mobile communications device. The heat pipe can be inserted through the headset jack to transfer heat directly from the processor to an external heat sink. The headset connector can be modified to include a standard jack and an internal heat sink that connects to the PCB directly opposite the heat source.

Based on thermal analysis, the die temperature of the applications processor in the electronic communications device can be 70° C. with the heat pipe connector solution to the external heat sink, which is significantly cooler than a hotter 113° C. for a conventional electronics communications without the heat pipe connector solution to an external heat sink.

The improved mobile communications system can comprise a mobile electronics communications device having electrical components for electronic communications. In operation and use, the electrical components generate heat. The improved mobile communications system can have an external heat sink and a heat transfer device to transfer heat from the mobile electronics communications device to the external heat sink. The external heat sink can comprise a holder, cradle, or dock station such as a mobile computing device dock station or dock for docking, cradling and/or holding the mobile communications device. The heat sink can further comprise an external heat spreader or external heat collector. The heat transfer device can provide an external heat transfer device comprising an external heat conductor or heat pipe. The electronic components can include a headset jack or headphone jack connector for connection to the heat transfer device. The electronic communications device can include an internal heat sink comprising an internal heat collector for thermal connection to the heat transfer device and can include one or more thermal shields comprising thermal couplings for coupling at least one or more of the electronic components, such as a processor, charger and/or radio frequency power amplifier (RF PA), to the internal heat sink.

The electronic communications device can comprise one or more of the following: a portable electronic device, a radiotelephone, cellular (cell) phone, mobile phone, smart phone, qwerty phone, flip phone, slider phone, Android® phone, Blackberry® phone, tablet phone, camera phone, clamshell device, portable networking device, portable gaming device, mobile communications device, personal digital assistant (PDA), wireless email device, a two way pager, internet communication device, Android® tablet, iPod®, iPad®, Kindle®, electronic reading device, electronic photo frame, digital photo frame, digital picture frame, video player, audio player, electronic calculator, electronic monitor, tablet device, video device, electronic processor, mobile computing device, computer, netbook, data sharing device, wireless device, handheld electronic communications device, global positioning system (GPS), navigation device, transmitting device, electronic receiving device, electronic planner, workout planner, electronic calendar, scheduling device, music player, MP3 player, performance monitor, golf tracker, incoming call notifier, answering machine, statistical storage device, data storage device, information storage device, cadence sensor, goal setting device, fitness tracker, exercise monitor, sports monitor, workout frequency monitor, downloadable device, computer, Bluetooth® compatible device, data sharing device, and a hand held electronic device.

The following is a detailed description and explanation of the preferred embodiments of the invention and best modes for practicing the invention.

Figure 4:
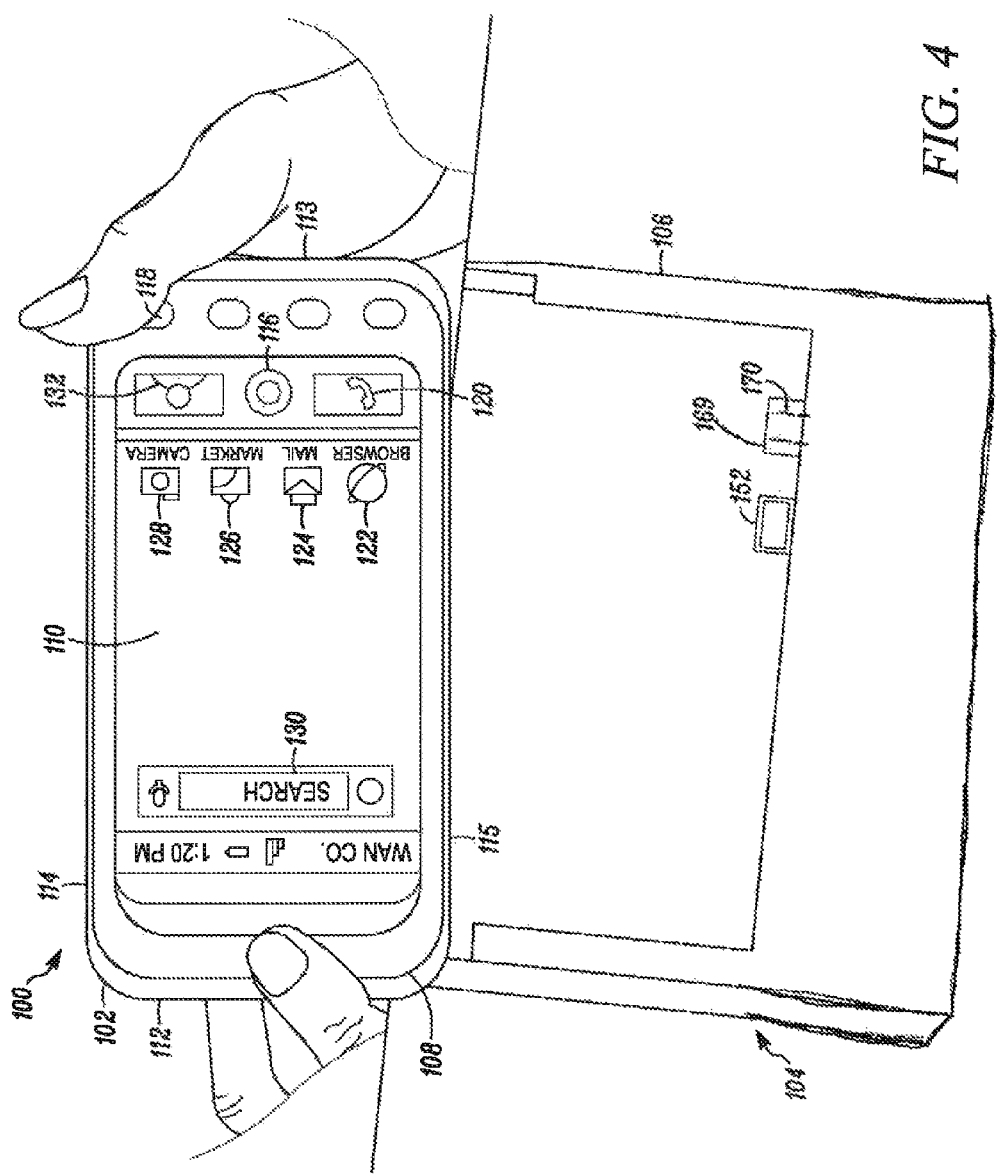
FIG. 4 is a reduced perspective view of part of an electronic communications system with a holder assembly such as a mobile computing device dock station comprising a dock heat exchanger for cradling, docking and cooling an electronic communications device, such as a mobile phone, in accordance with principles of the present invention.

Referring to FIG. 4 of the drawings, a mobile electronic communications system 100, also referred to as a mobile communications system, can include a mobile electronic communications device 102 that can be held, docked and/or cradled in a mobile electronics communications device-receiving holder assembly 104 comprising a mobile electronics communications device-receiving holder 106 which is also referred to as mobile communications holder and can comprise a mobile computing device dock station. The electronic communications device can be operable for mobile phone communications. The electronic communications device can be moveable and pivotable from a landscape orientation mode (landscape mode or landscape orientation) to a portrait orientation mode (portrait mode or portrait orientation) and vice versa.

The mobile electronic communications device can have a display module and a chassis which can comprise a modular housing assembly with a modular housing 108 (FIG. 4) to securely hold the display module. The display module can comprise an electronic visual display 110 for displaying images. The electronic visual display can comprise an elongated, generally rectangular display lens. The display lens can comprise a user interface (UI) and can have a touch sensitive haptic elongated front lens surface. The display lens can comprise: a glass lens, transparent lens, touch sensitive lens, haptic lens, screen, impact-resistant screen, display screen, touchscreen, screen with an accelerator, monitor, light emitting display, or combinations of any of the preceding. The touch sensitive surface of the lens can have touch sensors which generate a signal in response to a manually engageable haptic input from a user when the user touches the touch sensitive surface of the lens with a finger. Touch sensors can be located behind the front surface of the lens or behind the back surface of the lens. The user interface and a display module can comprise a light emitting display for emitting light forming an image on the lens in response to the signal. The display module can also have piezoelectric elements that can provide haptics with direct piezoelectric bending action for allowing substantial transfer of mechanical vibration energy.

The modular housing assembly can have a front housing section, a back housing section and rounded corners. The modular housing can have substantially parallel lateral edges 112 and 113 (FIG. 4) providing the ends of the electronics communications device and substantially parallel longitudinal edges 114 and 115 providing the sides of the electronics communications device which can extend between and integrally connect the lateral edges. The back housing section can provide a rearward housing with a back surface which can comprise the back of the modular housing assembly and electronic communications device. The front housing section can provide a front housing with a front surface which can comprise the front of the modular housing assembly and electronic communications device.

The mobile electronic communications device can have various control buttons 116 (FIG. 4) including volume control buttons and operating keys 118. The control buttons can include an on-off power button, a sleep mode button, an airplane mode button, or combinations thereof. The mobile electronic communications device can also include various program applications (APs) capable of operating at normal or rapid data rate communications. The applications can be represented by different icons. Examples of such applications can include, but are not limited to: a cellular telephone application 120, mobile web browser application 122, e-mail application 124, stock market and/or internet shopping application 126, camera application 128, internet search application 130, and/or social media application 132.

The modular housing of the electronic communications device of the mobile communications systems can at least partially enclose electrical components which are also referred to as internal electronic components. The electrical components perform functions of the mobile communications device while generating heat as a waste byproduct. As shown in FIG. 1, the electrical components can include: a printed circuit board (PCB) 140, at least one battery 142 comprising a battery cell that is operatively connected to the PCB for powering the components, a headset jack 144 that is operatively connected to the PCB, a processor 146, such as a quad core processor or applications processor which can comprise a central processing unit (CPU) including an integrated circuit (IC) chip that is operatively connected to the PCB; a battery voltage regulator 148 comprising an internal power charger providing an internal battery charger (not shown) and adapter that is operatively connected to the PCB for receiving an external battery charger 152 (FIG. 4) to charge the battery; and a radio frequency (RF) power amplifier (PA) 154 (FIG. 1) that is operatively connected to the PCB.

The mobile electronic communications device can have one or more antennas 155 and 156 (FIG. 1) for transmitting and receiving electrical signals. The antennas can be connected and/or grounded to the PCB. The antennas can comprise one or more of the following or combinations thereof: RF antenna, wide area network (WAN) antenna, local area network (LAN) antenna, global positioning system (GPS) antenna, WiFi antenna, Bluetooth antenna, multi-mode antenna, multiple-input/multiple output (MIMO) antenna, multi-band folded inverted conformal antenna, diversity antenna, and/or internal antenna.

The RF power amplifier can comprise an electronic amplifier to convert a low-power RF signal into a larger signal of significant power, typically for driving the antenna and other components of a transmitter and/or transceiver of the electronic communications device.

Voltage regulators, such as the battery voltage regulator, can be used in the cellular phone or other electronic communications device to improve and increase battery life. Voltage regulators can also be used to step down the voltage between the battery and the different sub-circuits that require lower supply voltage, or to step up the voltage for sub-circuits that need higher voltage than the battery, such as a Subscriber Identity Module card (SIM card), backlit light emitting diode (LED) circuit, etc. Voltage regulators can also be used to isolate the different subsystems from each other. This is important in the radio frequency (RF) section and also between digital and analog/mixed signal circuits. Furthermore, voltage regulators can be used to isolate sensitive circuitry from the transient voltage changes of the battery.

The mobile electronics communications device can have a mobile electronics communications device-heat collector 157 (FIG. 1) comprising an internal heat sink which is thermally connected by thermal shields comprising internal thermal couplers 158-160 to the electrical components including the headset jack, processor, power charger and RF PA. In the preferred embodiment, a thermal metal processor-shield comprising a thermal processor-coupler 158 thermally couples the processor to the internal heat sink for providing a thermal processor-pathway to conduct and dissipate heat generated from the processor to the internal heat sink. A thermal metal charger-shield comprising a thermal charger-coupler 159 thermally couples the internal power charger to the internal heat sink for providing a thermal charger-pathway to conduct and dissipate heat generated from the power charger to internal heat sink. A thermal metal RF PA-shield comprising a thermal RF PA-coupler 160 thermally couples the RF PA to the internal heat sink for providing a thermal RF PA-pathway to conduct and dissipate heat generated from the RF PA to the internal heat sink.

Figure 2:
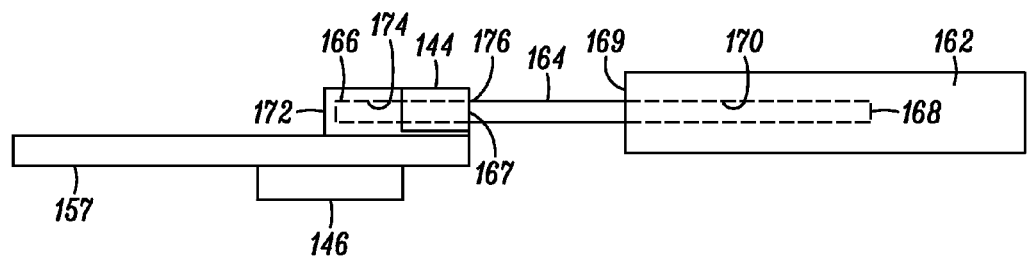
FIG. 2 is an enlarged diagrammatic front view of a modified headphone jack connector for heat pipe insert and illustrating part of an electronic communications system with a headset jack-heat pipe interface for help cooling electronic components in an electronic communications device and transferring heat to a holder assembly, such as a mobile computing device dock station comprising a dock heat exchanger, in accordance with principles of the present invention.

As shown in FIG. 2, the mobile electronics communications device-receiving holder assembly (holder assembly) comprising the mobile communications holder can have a mobile electronic communications holder-heat sink 162 comprising a mobile communications holder-heat collector providing an external heat sink for collecting and dissipating heat from the electrical components and the internal heat sink in the mobile electronic communications device.

The mobile electronics communications system can have an external heat transfer device 164 (FIG. 2) comprising an elongated external heat pipe providing an external thermal conduit for transferring and dissipating heat from the internal heat sink of the mobile electronics communications device to the external heat sink of the holder comprising the mobile electronics communications device-receiving holder assembly. The heat pipe can have an inner end 166 (FIGS. 1 and 2) comprising a headset jack-connector providing a headset jack-heat pipe interface 167 for connection to the headset jack and the internal heat sink of the mobile electronics communications device and can have an outer end 168 comprising an external heat sink-connector providing a heat pipe-mobile communications holder-heat sink interface 169 for connection to the external heat sink of the mobile communications holder.

In the illustrative embodiment of FIG. 2, the external heat sink can have a sleeve 170 for receiving the outer end of the heat pipe. The internal heat sink of the electronics communications device can include an integral internal heat sink extension 172 with a socket 174 therein for receiving the inner end of the external heat pipe. The headset jack can have a heat pipe-receiving opening 176 extending through the headset jack for providing a heat transfer gateway for receiving the heat pipe.

Figure 5:
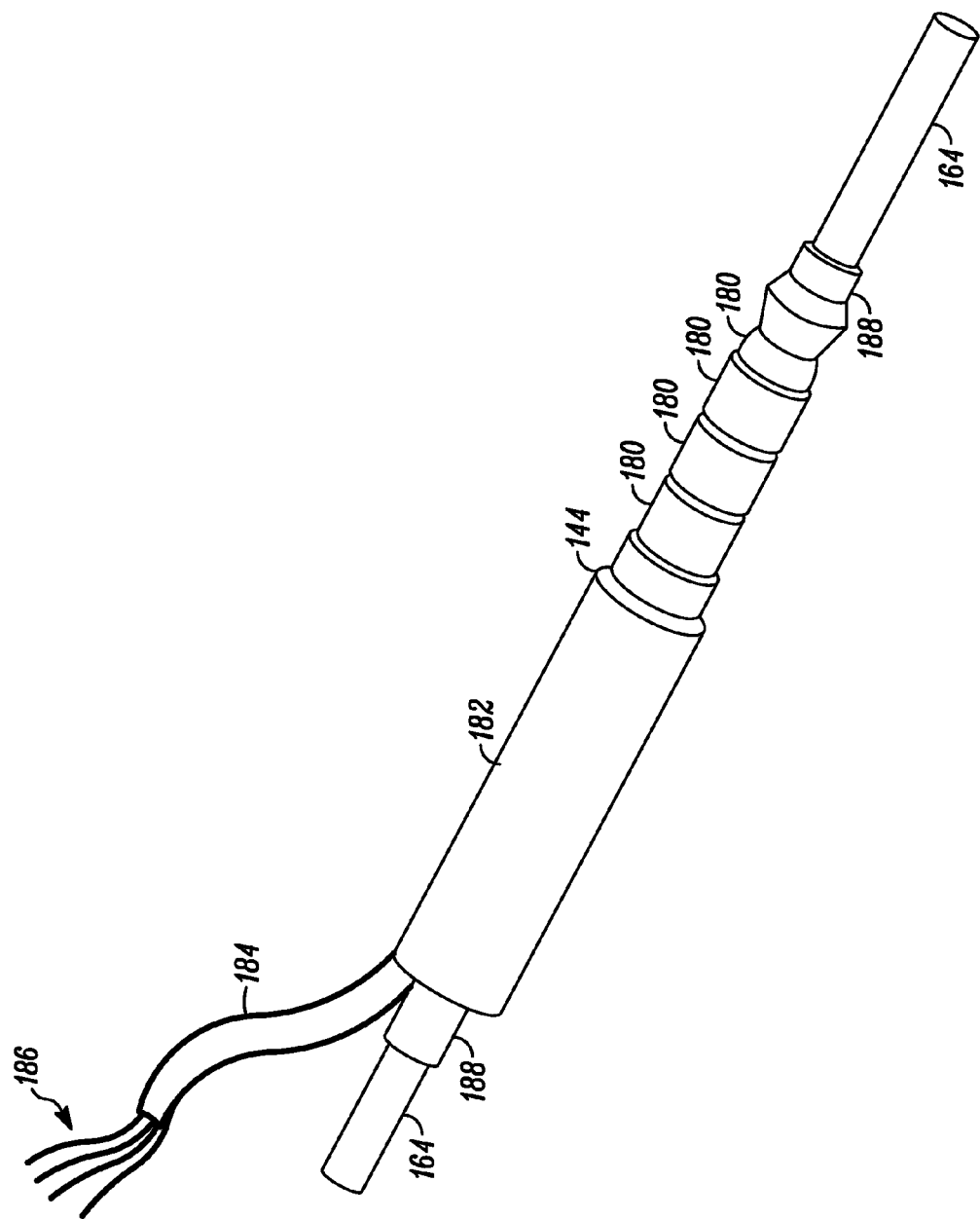
FIG. 5 is an enlarged fragmentary perspective view of headset jack assembly with a heat pipe extending therethrough in accordance with principles of the present invention.

The headset jack assembly 144 (FIG. 5) can have: electrical contacts 180 and electrical and thermal insulation 182 for handling, as well as an electrical wire bundle 184 and electrical signal leads 186. The heat pipe 164 can extend through the elongated heat pipe-receiving opening of the headset jack assembly. An electrical and thermal insulation sleeve 188 can be positioned around the heat pipe to prevent contact with the electrical paths.

In particular, FIG. 2 depicts an enlarged diagrammatic front view of a modified headphone jack connector for heat pipe insert and illustrates part of an electronic communications system with a headset jack-heat pipe interface for help cooling electronic components in the electronic communications device and transferring heat to a holder assembly such as a mobile computing device dock station comprising a dock heat exchanger. As shown in FIG. 2, the standard headset jack connector can be modified to include a headset jack extension for receiving and connection to a heat pipe. The headset jack extension can be thermally connected to the internal heat sink which can be connected to PCB directly opposite one or more heat sources. This arrangement can provide for efficient heat transfer from a high heat generation source, such as a quad core processor, located inside the mobile electronics communications device via the heat pipe thermally connected directly to a larger external heat sink, e.g. car dock or deck dock, for effective heat dissipation. In the arrangement and system of FIG. 2, the heat transfer device, e.g. heat pipe, can be inserted through the headset jack to transfer heat directly from the quad core processor to the external heat sink.

In use, the headset jack is useable in: (1) a headset position for connection to an audible device, such as one or more of the following: a headset, head phone, ear plugs, ear buds, earset, earpiece, audibly receiver, audible transmitter, audible transceiver, and combinations thereof; and (2) a heat transfer position to help transfer heat generated by the electrical components and from the internal heat sink of the mobile electronics communications device to the heat pipe.

The heat pipe can comprise: a copper heat pipe, copper alloy heat pipe, aluminum heat pipe, aluminum alloy heat pipe, carbon based heat pipe, carbon fiber heat pipe, metal pipe, thermal conductor, tubular heat conductor, metal conductor, a solid conductor, elongated rod, metal rod, carbon fiber rod, carbon fiber tube, metal tube, or combinations of any of the preceding.

The external heat sink of the holder comprising the mobile electronics communications holder-assembly can comprise an external heat exchanger comprising: an aluminum external heat sink, copper external heat sink, composite external heat sink, graphite external heat sink, metal external heat sink, stamped external heat sink, die cast external heat sink, sheet metal external heat sink, or combinations of the preceding external heat sinks.

The mobile electronics communications device-receiving holder can comprise an external heat sink and a dock heat exchanger with: a dock station such as a mobile computing device dock station or dock, e.g. a car dock, deck dock, or lap dock, and/or providing a cradle, an external battery charger, an electronics communications device-receiving case, or combinations of the preceding. The external battery charger can comprise: a universal serial bus (USB) battery charger, USB vehicle charger, USB power adapter, dual USB vehicle charger, micro USB vehicle charger, mini USB vehicle charger, international multi-plug USB travel adapter, universal USB travel charger, European (EU) plug universal USB charger, universal dual USB wall charger, dual USB car charger, universal travel battery charger, universal battery charger, vehicle cigarette lighter adapter, vehicle cigarette lighter battery charger, wall charger, travel wall charger, alternating current (AC) battery charger, AC charger adapter, international battery charger, car charger, plug-in car charger, combo charger, power station, lithium-polymer battery charger, dock charger, or combinations of any of the preceding external battery chargers.

The internal heat sink comprising the mobile electronics communications device can comprise: a telecommunications internal heat sink, aluminum internal heat sink, copper internal heat sink, composite internal heat sink, graphite internal heat sinks, metal internal heat sink, processor heat sink, IC chip heat sink, PCB heat sink, telecom heat sink, or combinations of any of the preceding internal heat sinks.

Heat sinks can be made of metal, which serves as the thermal conductor that carries heat away from the heat source, such as a CPU. However, there are pros and cons to using every type of metal. First each metal has a different level of thermal conductivity. The higher the thermal conductivity of the metal, the more efficient it is at transferring heat. One of the most common metals used in heat sinks is aluminum. Aluminum has a thermal conductivity of 235 watts per Kelvin per meter (W/mK). The higher the thermal conductivity number of a metal, the more effectively that metal conducts heat. Aluminum is also inexpensive to produce and is lightweight. When a heat sink is attached, its weight puts a certain level of stress on the motherboard or processor, which the motherboard or processor is designed to accommodate. Yet, the lightweight make up of aluminum is beneficial because it adds little weight and stress to the motherboard or processor. One of the best and most common materials used to make heat sinks is copper. Copper has a very high thermal conductivity of 400 W/mK. It is, however, heavier than aluminum and more expensive. Composite heat sinks can be made by bonding copper and aluminum together. Another material that can be used for heat sinks is a natural graphite composite material. It is not as conductive as copper, but it is close with a thermal conductivity of 370 W/mK. Other materials can be used for heat sinks.

Each of the couplers can comprise an internal thermal coupler, such as: a copper coupler, copper alloy coupler, aluminum coupler, aluminum alloy coupler, carbon based coupler, carbon fiber coupler, metal coupler, coupler with a thermally conductive surface, coupler with at least one thermally conductive coating thereon, thermal conductor, graphite film coupler, ribbon coupler, sheet coupler, solid coupler, tubular coupler, heat conductive coupler, or combinations of the preceding internal thermal couplers.

The PCB can comprise: a rigid PCB, a flexible PCB, a single-sided PCB, a double-sided PCB, a multi-layered PCB, or combinations of any of the preceding PCBs.

In the preferred embodiment, the mobile electronics communications device can comprise: a portable handheld electronic device, such as: a radiotelephone, cellular (cell) phone, mobile phone, smart phone, qwerty phone, flip phone, slider phone, Android® phone, tablet phone, camera phone, clamshell device, portable networking device, mobile computing device, mobile electronic processor, mobile computer, personal digital assistant (PDA), wireless e-mail device, two way pager, internet communication device, Android® tablet, iPod®, iPad®, Kindle®, electronic reading device, or combinations of any of the preceding.

Figure 3:
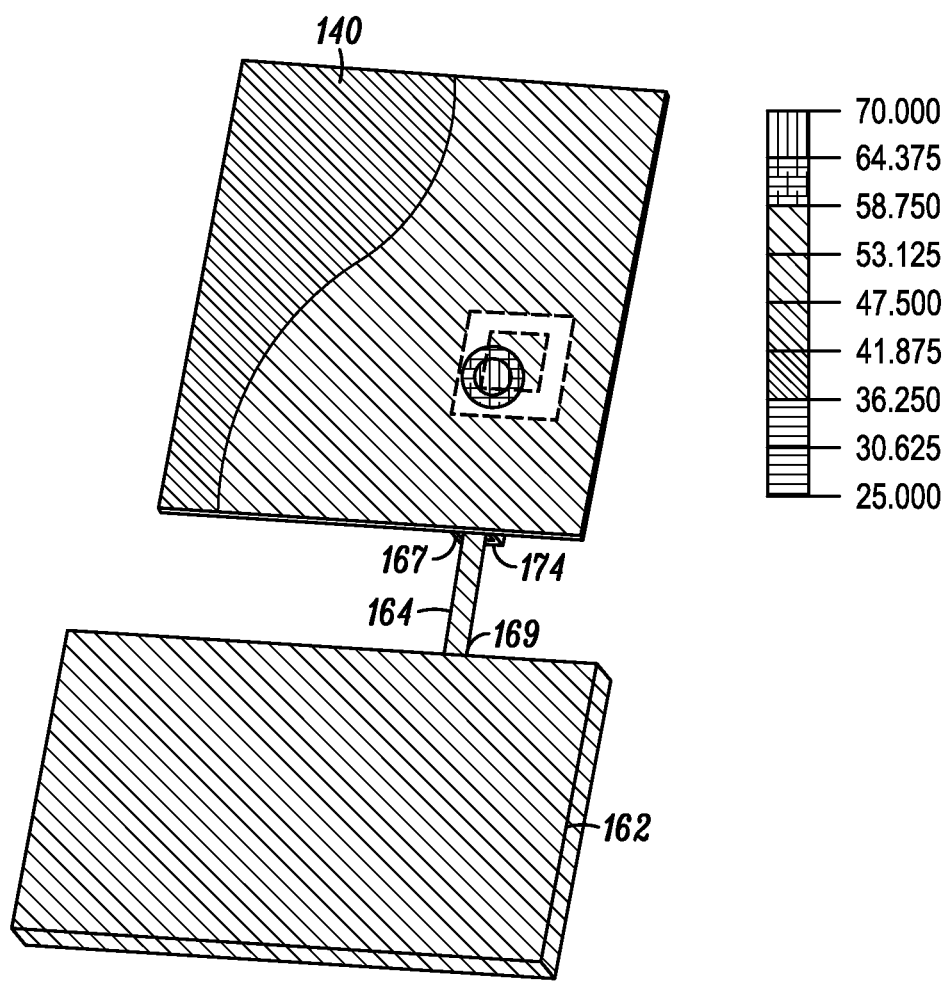
FIG. 3 is a diagrammatic top view of part of an electronic communications system with a PCB, heat pipe and heat sink as analyzed by a quadcore 4 watt processor in accordance with principles of the present invention.

FIG. 3 illustrates a diagrammatic top view of part of an electronic communications system with a PCB, heat pipe and external heat sink as analyzed and powered by a quadcore 4 watt processor. Test results indicated that the die temperature of electronic communications device was 70° C. when using the heat pipe and external heat sink, which was significantly lower that the die temperature of 113° C. of a conventional communications device without a heat pipe and external heat sink.

Among the many advantages of the electronic communications system with a headset jack-heat pipe interface are:
1. Superior heat transfer.
2. Superb cooling of the mobile computing device or cell phone.
3. Enhanced performance of the electronic communications device.
4. Excellent heat exchange.
5. Better battery charging.
6. Reliable.
7. Safe.
8. Portable.
9. User friendly.
10. Easy to use.
11. Durable.
12. Economical.
13. Attractive.
14. Efficient.
15. Effective.

The improved electronics communications system as set forth in the patent claims hereafter has achieved unexpected surprisingly good results.

Although embodiments of the invention have been shown and described, it is to be understood that various modifications, substitutions, and rearrangements of parts, components, and/or process (method) steps, as well as other uses of the electronic communications system and mobile computing device dock station with a headset jack-heat pipe interface can be made by those skilled in the art without departing from the novel spirit and scope of this invention.

What is claimed is:

1. A system comprising:
a modified headset jack connector; and
an electronic communications device,
the modified headset jack connector comprising:
a heat pipe-receiving opening extending through the modified headset jack connector; and
a heat pipe housed by the modified jack connector via the heat pipe-receiving opening,
the electronic communications device comprising:
one or more electrical components that generate heat when in operation;
a device heat sink internal to the electronic communications device and thermally connected to the one or more electrical components effective to transfer the heat, generated by the one or more electrical components when in operation, to the device heat sink; and
a headphone jack port thermally coupled to the device heat sink, the headphone jack port structurally configured to:
receive the modified headset jack connector;
enable the heat pipe to thermally connect to the device heat sink internal to the electronic communications device effective to provide a first thermal pathway to a holder heat sink external to the electronic communications device;
enable external transfer of at least some of the heat generated by the electronic communications device through the first thermal pathway; and
transfer one or more electrical signals from the electronic communication device to the modified headset jack connector via one or more electrical contacts.

2. The system in accordance with claim 1, wherein the one or more electric components thermally connected to the device heat sink internal to the electronic communications device comprise at least one of:
a processor;
a printed circuit board (PCB);
an integrated circuit (IC) chip; or
a battery.

3. The system in accordance with claim 1, wherein the electronic communications device comprises a mobile phone.

4. The system in accordance with claim 1, wherein the headphone jack port is configured to transfer audio output via the one or more electrical contacts.

5. The system in accordance with claim 1, wherein the device heat sink internal to the electronic communications device is thermally connected to a thermal metal charger-shield to provide a second thermal pathway between the device heat sink and a power charger associated with the electronic communications device.

6. The system in accordance with claim 1, wherein the headphone jack port comprises a socket configured to receive the heat pipe.

7. The system in accordance with claim 1, wherein the device heat sink internal to the electronic communications device comprises:
an aluminum heat sink;
a copper heat sink;
a composite heat sink; or
a graphite heat sink.

8. The system in accordance with claim 1, wherein the headphone jack port is thermally coupled to the device heat sink through:
a copper thermal coupler;
a copper alloy thermal coupler;
a carbon based thermal coupler;
an aluminum thermal coupler; or
a thermal coupler with a conductive coating.

9. The system in accordance with claim 1, further comprising at least one antenna associated with wireless communications.

10. The system in accordance with claim 1, further comprising an adapter operatively coupled to a battery internal to the electronic communications device effective to enable charging the battery using an external source via the adapter.

11. A system for transferring heat generated by an electronic device, the system comprising:
a holder assembly for receiving and holding the electronic device;
a heat sink comprising an interface configured to enable the electronic device to make a thermal connection to the heat sink, the heat sink configured to provide a heat collector for collecting and dissipating at least some of the heat generated by the electronic device; and
a heat transfer device comprising:

a heat pipe for transferring the at least some of the heat generated by the electronic device to the heat sink;

a first end configured to connect with the electronic device via a headset jack socket interface; and a second end for connection to the heat sink via the interface effective to provide a thermal pathway between the electronic device and the heat sink using the heat pipe.

12. The system in accordance with claim 11, wherein the heat pipe comprises:
   a copper heat pipe;
   a copper alloy heat pipe;
   an aluminum heat pipe;
   an aluminum alloy heat pipe;
   a carbon based heat pipe;
   a carbon fiber heat pipe;
   a metal pipe;
   a thermal conduit;
   a thermal conductor;
   a tubular heat conductor;
   a metal conductor;
   a solid conductor;
   an elongated rod;
   a metal rod;
   a carbon fiber rod;
   a carbon fiber tube; or
   a metal tube.

13. The system in accordance with claim 11, wherein the interface comprises a sleeve configured to receive the second end of the heat transfer device.

14. The system in accordance with claim 11, wherein the holder assembly comprises:
   a dock;
   a car dock;
   a deck dock;
   a lap dock;
   a dock station;
   a mobile computing dock station;
   a docking station;
   a cradle; or
   an electronics communications device-receiving case.

15. The system in accordance with claim 11, wherein the holder assembly is configured to receive and hold:
   a mobile phone;
   a portable networking device; or
   an electronic reading device.

16. A system for transferring heat generated by an electronic device, the system comprising:
   an electronic device-receiving holder assembly comprising a holder for receiving and holding the electronic device, the electronic device-receiving holder assembly comprising a heat sink comprising an interface configured to enable the electronic device to make a thermal connection to the heat sink, the heat sink configured to provide a heat collector for collecting and dissipating at least some of the heat generated by the electronic device using the interface; and
   a heat transfer device comprising:
      an elongated heat pipe for transferring the at least some of the heat generated by the electronic device to the heat sink via the interface; and
      a modified headset jack connector configured to:
         house the elongated heat pipe effective to connect a first end of the elongated heat pipe to the heat sink via the interface and connect a second end of the elongated heat pipe to the electronic device via a headset jack socket effective to provide a thermal pathway between the electronic device and the heat sink; and
         connect with the headset jack socket effective to transfer electronic signals from the electronic device effective to play audio associated with the electronic signals using an audible device.

17. The system in accordance with claim 16, wherein the modified headset jack connector comprises a heat pipe-receiving opening extending through the modified headset jack connector for providing the thermal pathway between the electronic device and the heat sink.

18. The system in accordance with claim 16, wherein the elongated heat pipe comprises:
   a copper heat pipe;
   a copper alloy heat pipe;
   an aluminum heat pipe;
   an aluminum alloy heat pipe;
   a carbon based heat pipe; or
   a conductor.

19. The system in accordance with claim 16, wherein the electronic device-receiving holder comprises:
   a dock station;
   a cradle; or
   an electronics communications device-receiving case.

20. The system in accordance with claim 16, wherein the heat sink comprises:
   an aluminum external heat sink;
   a copper external heat sink;
   a composite external heat sink;
   a graphite external heat sink;
   a metal external heat sink;
   a stamped external heat sink;
   a die cast external heat sink; or
   a sheet metal external heat sink.

* * * * *